(12) United States Patent
Bayerer (10) Patent No.: US 7,466,185 B2
(45) Date of Patent: Dec. 16, 2008

(54) IGBT-DRIVER CIRCUIT FOR DESATURATED TURN-OFF WITH HIGH DESATURATION LEVEL

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 45 days.

(21) Appl. No.: 11/552,038

(22) Filed: Oct. 23, 2006

(65) Prior Publication Data

US 2008/0106319 A1 May 8, 2008

(51) Int. Cl.
*H03K 17/16* (2006.01)
(52) U.S. Cl. .................. 327/389; 327/375; 327/376; 327/377; 327/390; 327/391; 327/423; 327/434
(58) Field of Classification Search ......... 327/375–377, 327/389–391, 427, 430, 431, 433–437, 423, 327/424
See application file for complete search history.

(56) References Cited

U.S. PATENT DOCUMENTS

| 5,055,721 | A | * | 10/1991 | Majumdar et al. .......... 327/434 |
| 5,559,656 | A | * | 9/1996 | Chokhawala ................ 361/18 |
| 6,275,093 | B1 | | 8/2001 | Shekawat et al. |
| 6,369,543 | B1 | * | 4/2002 | Masselus et al. ............ 318/700 |
| 6,809,561 | B2 | * | 10/2004 | Katoh et al. ................ 327/108 |
| 6,897,707 | B2 | | 5/2005 | Beck |
| 2002/0070772 | A1 | | 6/2002 | Neacsu et al. |
| 2002/0167826 | A1 | | 11/2002 | Hochstuhl et al. |
| 2006/0186933 | A1 | | 8/2006 | Kimura et al. |
| 2007/0070567 | A1 | * | 3/2007 | Bayerer et al. .............. 361/100 |

FOREIGN PATENT DOCUMENTS

| DE | 102005045099 A1 | 8/2006 |
| WO | WO-05104743 | 11/2005 |

OTHER PUBLICATIONS

Bohllander, M., et al., "Desaturated Switching of Trench—Fieldstop IGBTs", (2006).

* cited by examiner

*Primary Examiner*—Kenneth B. Wells
*Assistant Examiner*—John W Poos
(74) *Attorney, Agent, or Firm*—Schwegman, Lundberg & Woessner, P.A.

(57) ABSTRACT

A driver circuit comprising an insulated gate bipolar transistor having a collector coupled to a voltage supply, an emitter coupled to a source of reference potential, and a gate configured to receive a control signal from a driver circuit, and a desaturation circuit conductively coupled between an insulated gate and a collector of the insulated gate bipolar transistor to desaturate the insulated gate. The desaturation circuit includes a series coupled bias voltage source, uni-directionally conducting element and switch.

16 Claims, 13 Drawing Sheets

IGBT-DRIVER CIRCUIT FOR DESATURATED TURN-OFF WITH HIGH DESATURATION LEVEL

TECHNICAL FIELD

Embodiments of the present invention relate generally to Insulated Gate Bipolar Transistors and more particularly to driver circuits for the operation of Insulated Gate Bipolar Transistors.

BACKGROUND

Insulated Gate Bipolar Transistors are used for achieving high switching frequency in switching applications. Gate driver circuits are required for the proper performance and ensure reliability of insulated gate bipolar transistor (IGBT) circuits.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Modern IGBT generations are characterized by high carrier concentrations in the conduction state. This results in a more pronounced carrier storage effect and a different turn-off behavior compared to that of former generations. Turn-off under inductive load for Trench-Fieldstop IGBTs shows a dip in the gate voltage at the end of the Miller Plateau. In correlation with this dip, the rise of the collector voltage ($dV_{CE}/dt$) of these IGBTs is intrinsically limited. The lowering of $V_{CE\text{-}sat}$ described above is caused by higher carrier concentration in the conduction state. To reduce the switching losses and to improve the switching behavior of such low $V_{CE\text{-}sat}$ IGBTs, a type of desaturated switching can be performed. By desaturated switching, the storage charge concentration is reduced prior to turn-off. Thus, the dependence of the turn-off procedure by the storage charge can be reduced. As switching frequencies for power converters range typically from about 2.5 kHz to about 4 kHz, power losses are dominated by conduction losses and hence reduction of on-state losses is critical.

Figure 1:
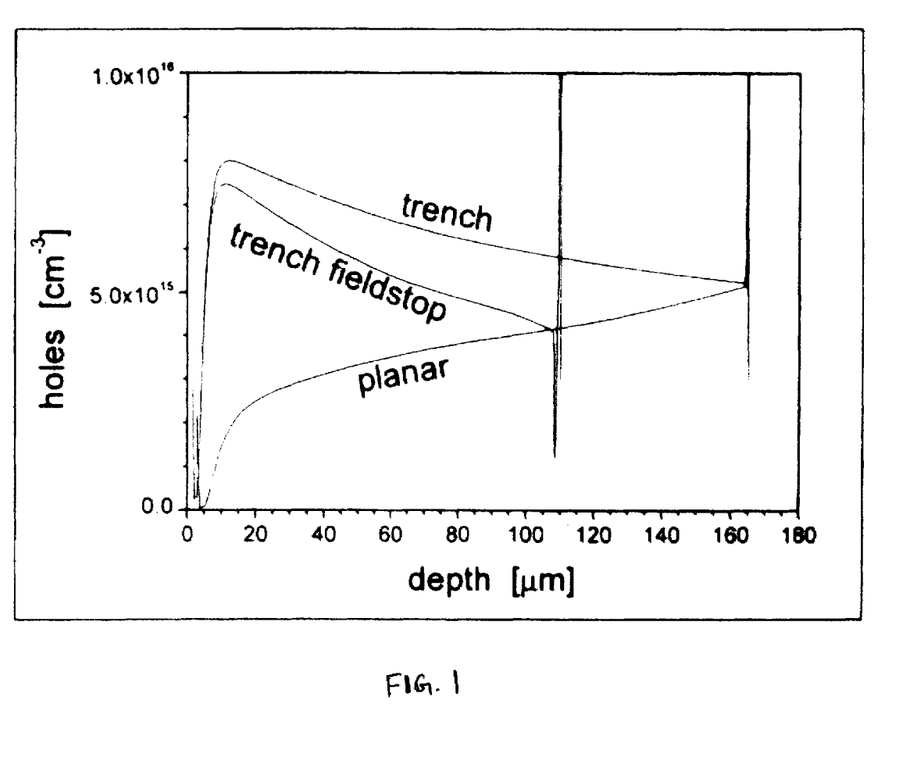
FIG. 1 illustrates the charge carrier distribution (linear scaled) of several IGBT generations during conduction state.

FIG. 1 illustrates the charge carrier distribution (linear scaled) of several IGBT generations during conduction state. Since the introduction of IGBTs, the fabrication technologies of IGBT wafers have been improved continuously leading to reduction in wafer thickness and increase in the complexity of cell structures. An example of such is the Fieldstop IGBT with trench technology. The Fieldstop layer has led to a significant reduction of wafer thickness (comparing traces of Planar, Trench and Trench-Fieldstop IGBTs shown in FIG. 1). The saturation voltage $V_{CE\text{-}sat}$ is reduced despite an increased current density.

Figure 2A:
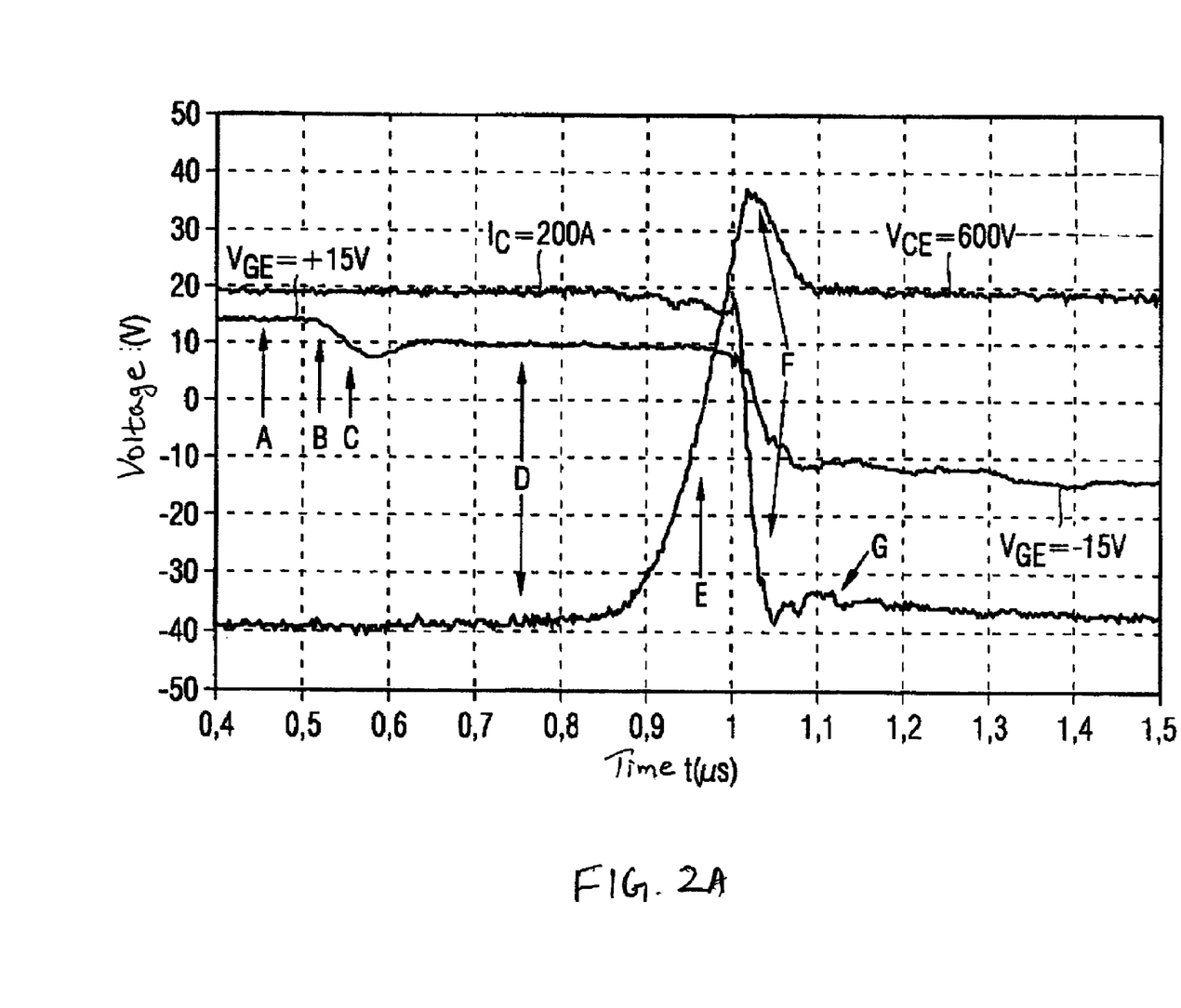
FIG. 2A illustrates the device characteristics during shutdown of an IGBT with planar cell geometry.
Figure 2B:
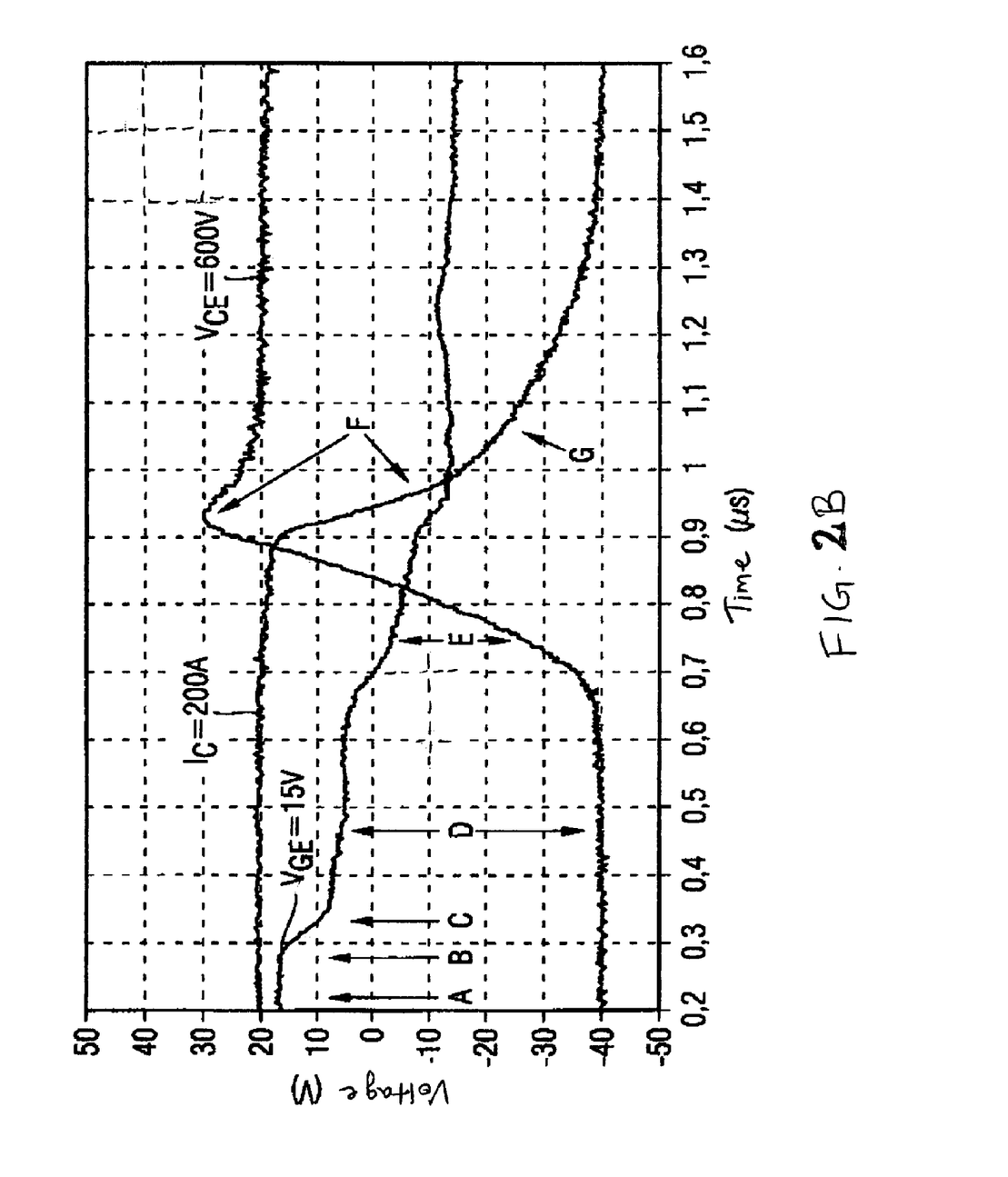
FIG. 2B illustrates the device characteristics during shutdown of an IGBT having a field-stop with trench gate cells.

FIG. 2A and FIG. 2B illustrate respectively the device characteristics during shutdown of an IGBT having a planar gate cell and an IGBT having a field-stop with trench gate cell. The change in carrier distribution seen in IGBTs having a planar gate cell geometry in comparison to IGBTs having a field-stop with trench gate cell geometry results in a more pronounced carrier storage effect during turn-off. Comparison of the turn-off behavior between the IGBTs having a planar gate cell geometry and the IGBTs having a field-stop with trench gate cell geometry reveals several differences (see FIGS. 2A and 2B and FIG. 3).

FIG. 2A shows the time dependent behavior of signals during a switching-off operation of an IGBT having a planar cell geometry. At time marker "A", a voltage at the driver output is changed from +15V to −15V for initiating the switching-off operation (not shown). Illustrated is a gate voltage $V_{GE}$ present internally within the module at the IGBT. As a result of the potential difference to the gate of the IGBT, a current flow out of the gate arises, and current flow begins to discharge an input capacitance, i.e., the so-called Miller capacitance between gate and collector and the gate-emitter-capacitance (see time marker "B" showing characteristics of gate-emitter voltage $V_{GE}$).

Depending on the magnitude of this gate current, the IGBT changes from a saturation to a margin of the active region of the family of characteristic curves. During this phase, the gate voltage decreases (see time marker "C") and the collector voltage increases minimally. If the gate voltage $V_{GE}$ is at the Miller plateau (see time marker "D"), the collector voltage increases such that a polarity between gate and collector is reversed. During this process, the voltage between emitter and collector $V_{CE}$ increases to values in the range of from about 10 to 15V and a constant gate current flows. If the starting point of the voltage increase $dV_{CE}/dt$ is defined at the beginning of the Miller plateau is defined as $V_{GC}=0V$, the Miller capacitance on the voltage $V_{GC}$ results from a voltage dependent expansion of the space charge region between gate and collector. Because the voltage across Miller capacitance $C_{GC}$ is small in the on-state, a large charge has to be taken from it in order to achieve a small voltage change. During the Miller plateau, $V_{GE}$ is approximately constant. Thus, the capacitance between the gate and emitter is irrelevant during this time period, because no current is drawn during the Miller plateau from this capacitance due to the constant gate voltage.

At time marker "E" in FIG. 2A, the gate voltage is still at the Miller plateau. Following which, during the discharge state, the Miller capacitance decreases strongly, and the voltage between collector and emitter $V_{CE}$ is able to increase. The IGBT is now completely in the active region. The voltage between gate and emitter $V_{GE}$ decreases slightly and $V_{CE}$ and $I_C$ changes according to FIG. 2A. Here, the time dependent change of the voltage between collector and emitter $dV_{CE}/dt$ is only limited by the rate at which the capacitance between gate and collector $C_{GC}$ is discharged, which is determined by the magnitude of the gate discharge current $I_G$ and, thus, indirectly by a negative driver voltage and a gate resistance $R_G$. Since, the IGBT switches off an inductive load, the load current $I_C$ at the IGBT can only decrease when an alternate current path is available. Such an alternate current path is provided by a bypass diode/freewheel diode while beginning to switch-off load current $I_C$. The collector current $I_C$ is correlated to the voltage between gate and emitter $V_{GE}$. At unavoidable parasitic inductances, the current variation $dI_C/dt$ generates an excess voltage of corresponding magnitude at the IGBT. The bypass diode provides a path for the inductance current surge during the turn-off of the IGBT.

Illustrated in section "F" is the decrease of the load current $I_C$ in connection with the excess voltage at the collector. The decrease of load current $I_C$ in the IGBT is limited by the rate at which the input capacitance between gate and emitter $C_{GE}+C_{GC}$ is discharged and at which the voltage between gate and emitter $V_{GE}$ or the threshold voltage decreases. Thus, there is again a dependence on the discharge current $I_G$ of the gate. However, because $I_G$ is determined by the voltage difference between the driver output and the gate of the IGBT as well as by the impedance therebetween and this voltage difference decreases with increasing discharge state, a minimum time period, which cannot be decreased, is required for this. Thus, the curve of the gate voltage $V_{GE}$ as well as the curve of the collector voltage $V_{CE}$ of this IGBT of planar cell geometry is determined by the impedance of the gate circuit and of parasitic capacitances in the IGBT. The switching-off behavior of such an IGBT may therefore be varied extensively by changing the impedance of the gate circuit. Apart from that, a tail current is still flowing after that and this is due to the residual charge stored in the IGBT and that decreases with time, which is illustrated by the time period designated by "G".

Figure 3:
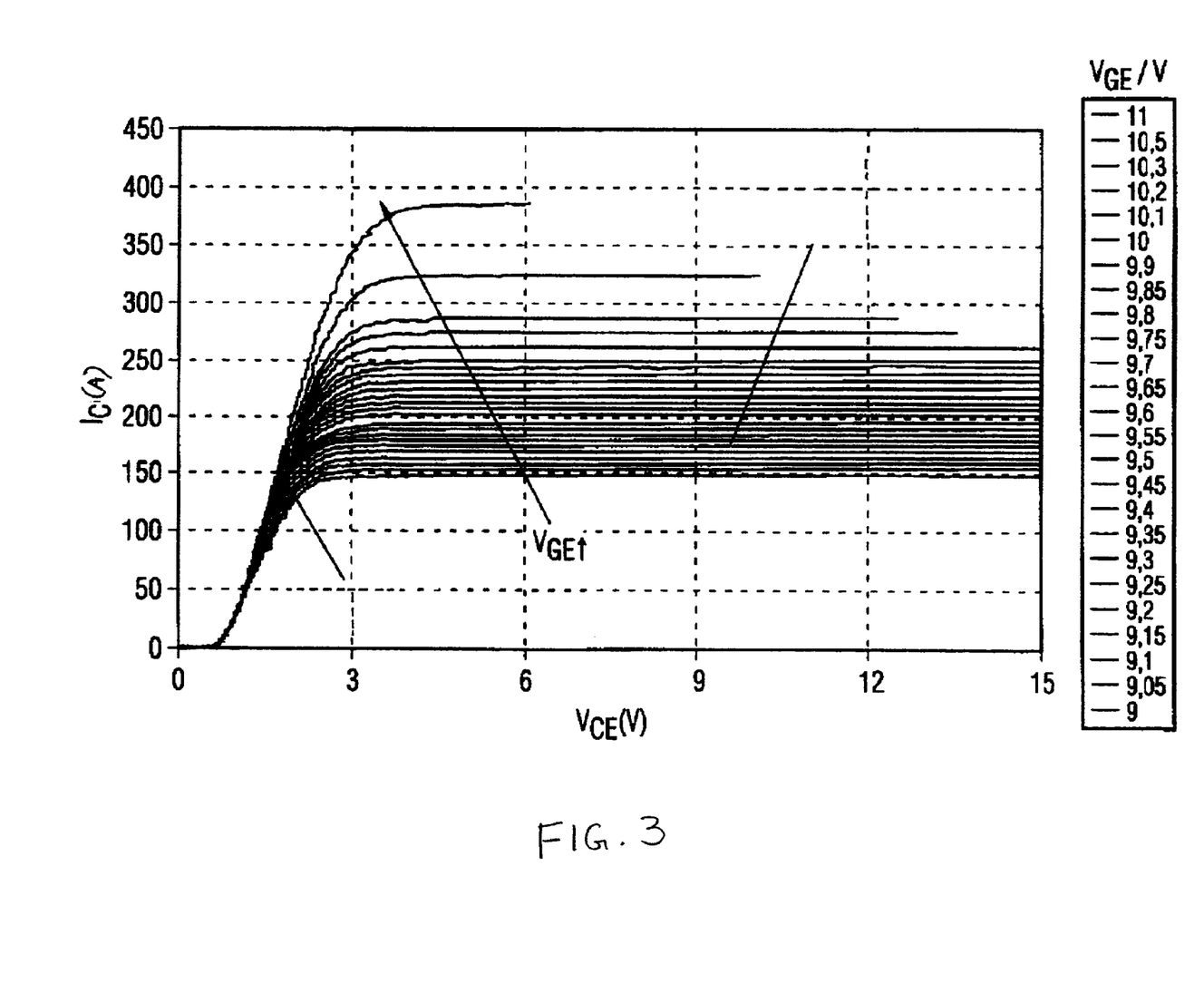
FIG. 3 illustrates the output characteristics of an IGBT showing sensitivity of collector current versus gate voltage.

Similar to FIG. 2A described above, FIG. 2B shows the characteristics of an IGBT having a field-stop with trench gate cells. The important differences explained here include the switching characteristics of such a device. At the end of the Miller plateau designated by time marker "D", a decrease in the gate voltage $V_{GE}$ can be observed in the region designated by a dip, although, the load current $I_C$ continues to flow at the same magnitude. As soon as $V_{GE}$ falls below the value of the Miller plateau and threshold voltage, the MOSFET within an IGBT that controls the Bipolar transistor within the IGBT, is turned off. Following which, the drain current of the MOSFET that controls the pnp-transistor, is turned off. However, $I_C$ continues to flow as shown in FIG. 3 and it is conducted by the stored charge. Until this point, when the dip starts, the IGBT behavior can be controlled by an outer driver circuit. After this point, the IGBT self-limits the turn-off speed. In other words, the voltage ramp $dV_{CE}/dt$ can not be increased further by a lower gate resistor (like in the case of former IGBT generations). The collector voltage rise ($dV_{CE}/dt$) is intrinsically limited and only influenced by load current and junction temperature. Consequently, the turn-off behavior of the current $I_C$ is softer for IGBTs having field-stop with trench gate cells and also results in a smaller collector voltage overshoot due to the stray inductance. As the difference in the switching behavior of IGBTs having field-stop with trench gate cells results from the high carrier concentration in the conduction state, performing a desaturation prior to turn-off will allow to speed up the IGBTs. Desaturation means to lower the carrier concentration towards the planar concentration (as shown in FIG. 1) by an increased $V_{CE-sat}$.

Figure 4:
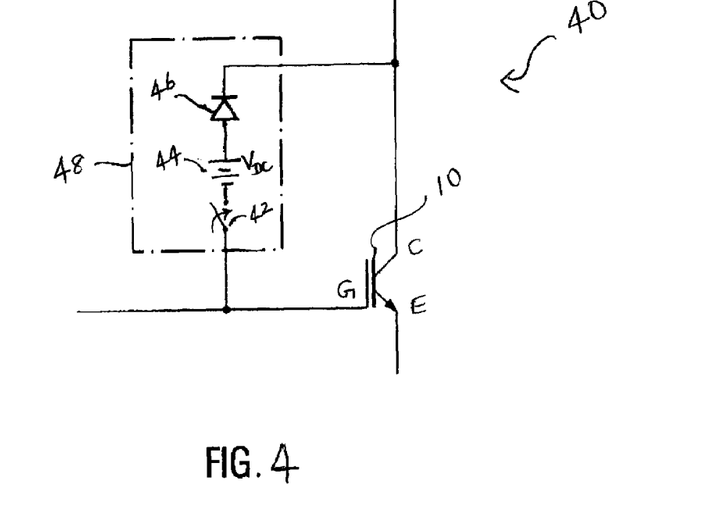
FIG. 4 is a schematic view of a desaturation circuit for an IGBT according to some embodiments of the invention.

FIG. 4 is a schematic view of a circuit 40 for an IGBT showing a desaturation circuit 48, according to some embodiments of the invention. Desaturation circuit 48 is coupled between gate "G" and collector "C" of IGBT 10 and includes, a switch 42, a voltage source 44, and a diode 46 coupled in series. Diode 46 is connected such that the cathode of diode 46 is coupled to collector, the anode of diode 46 is coupled to voltage source 44. Additionally, voltage source 44 is coupled to switch 42 which in turn is coupled to gate "G". In some embodiments, switch 42 is a bipolar transistor. In alternate embodiments, switch 42 is a MOSFET.

In operation, if the IGBT is in the switched "ON" operational position (conduction state), switch 42 is placed in the open position. In some embodiments, voltage $V_{GE}$ is about 15 Volts when IGBT 10 is in a conduction state. Following which, in some embodiments, desaturation is performed by placing the switch 42 in the closed position before IGBT 10 is turned off. In some embodiments, the delay between closing switch 42 and turning off IGBT 10 is between about 10ns and several micro-seconds. Charge from the gate "G" of IGBT 10 is discharged over diode 46 resulting in the rising of voltage $V_{CE}$ at the collector "C". IGBT 10 desaturates according to the equation given by $V_{CE}+V_{F\ (Diode)}=V_{GE}+V_{DC}$.

During this turning off procedure, the collector voltage $V_{CE}$ at collector "C" rises and typically the value of the rising collector voltage $V_{CE}$ rises in accordance with the output characteristic of IGBT 10 as shown in FIG. 3. This represents a simple desaturation circuit according some embodiments of the invention.

During desaturation, in some embodiments, the inclusion of voltage source 44 in desaturation circuit 48 allows for voltage difference between Gate "G" and Collector "C" to remain electrically isolated from the input signal to the gate of the IGBT. Consequently, in some embodiments, all the gate circuitry (not shown) beside the desaturation circuit 48 can be operated around 15 Volts. In some embodiments, this allows for the gate circuitry to be implemented using standard $I_C$ technologies. In some embodiments, the gate circuitry includes standard driver technologies.

In some embodiments, the voltage potential generated at voltage source 44 is around 2.5% of the rated voltage of IGBT 10. In some embodiments, the level of potential generated at voltage source 44 is chosen depending on the application in which IGBT 10 is used.

Figure 5:
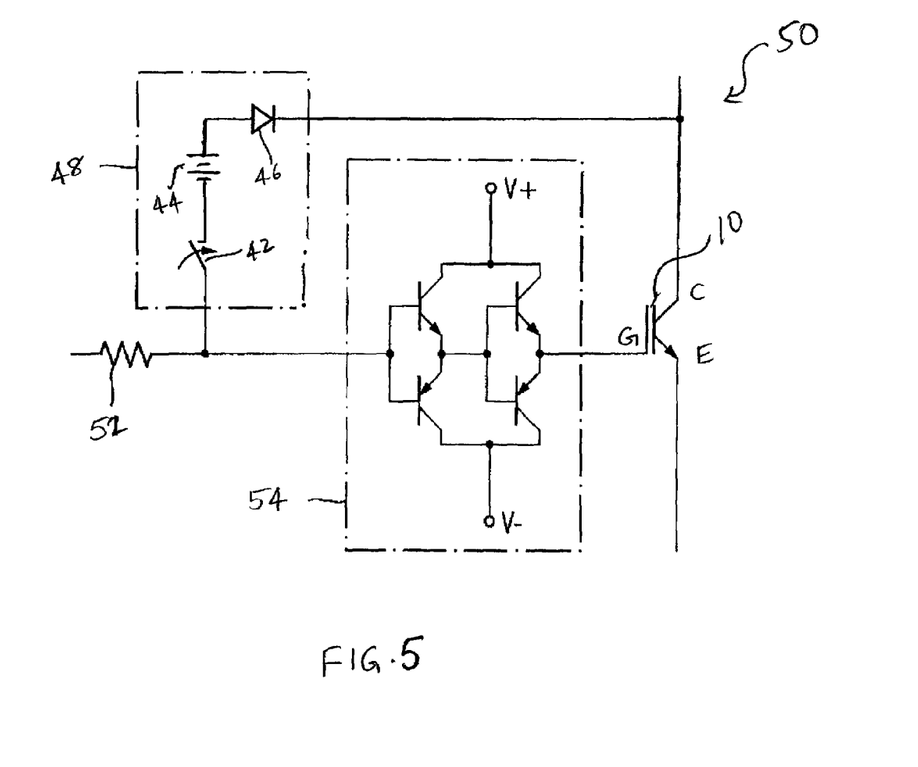
FIG. 5 is a schematic view of the desaturation circuit in accordance with FIG. 4 illustrating a current amplifier coupled to the gate of the IGBT, according to some embodiments of the invention.

FIG. 5 is a schematic view of some embodiments of the invention, showing a circuit 50 for an IGBT having a desaturation circuit 48 in accordance with FIG. 4 and adding a current amplifier 54, coupled to the gate of the IGBT. Desaturation circuit 48 and current amplifier 54 are coupled between gate "G" and collector "C" of IGBT 10. Desaturation circuit 48 includes, a switch 42, a voltage source 44, and a diode 46 coupled in series. Anode of diode 46 is coupled to the voltage source and cathode of diode 46 is coupled to collector "C" of IGBT 10. Additionally, a gate resistance 52 is provided as part of a gate control circuit (the remainder of which is not shown). Gate resistance 52 is coupled to the input of current amplifier 54 which in turn is connected to gate "G" of IGBT 10. In some embodiments, current amplifier 54 is a push-pull amplifier adapted to drive gate "G".

In operation, desaturation circuit 50 discharges the Miller capacitance accumulated between gate "G" and collector "C" by closing switch 42. In some embodiments, switch 42 is closed by using a logic circuit (not shown in figure). The charge essentially flows through the diode 46, switch 42, and voltage source 44 as described above for FIG. 4.

Figure 6:
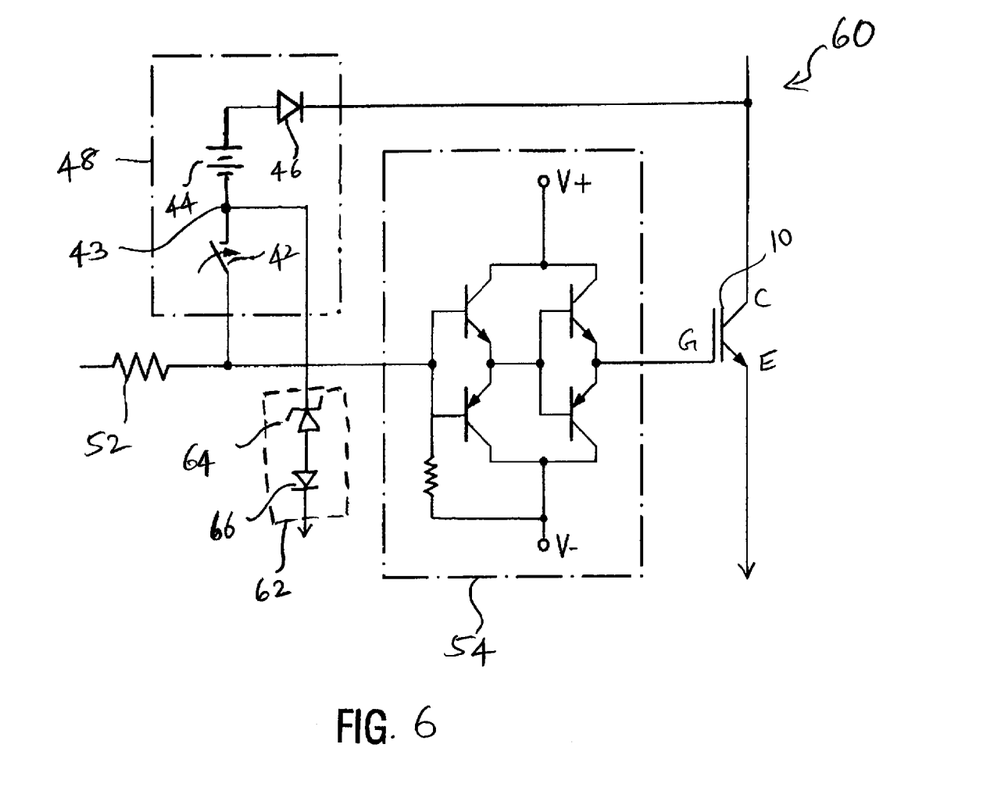
FIG. 6 is a schematic view of the desaturation circuit in accordance with FIG. 5 illustrating clamping of the IGBT using a Zener diode, according to some embodiments of the invention.

FIG. 6 is a schematic view of a circuit 60 for an IGBT in accordance with FIG. 5 illustrating a desaturation circuit 48 along with the clamping of the IGBT using a zener diode, according to some embodiments of the invention. Desaturation circuit 48 and current amplifier 54 are coupled between gate "G" and collector "C" of IGBT 10. As mentioned above in FIG. 4 and FIG. 5, desaturation circuit 48 includes, a switch 42, a voltage source 44, and a diode 46 coupled in series. An anode of diode 46 is coupled to the voltage source and a cathode of diode 46 is coupled to collector "C" of IGBT 10. Additionally, a node 43 located between switch 42 and voltage source 44 is coupled to one end of a voltage control circuit 62. The other end of voltage-control circuit 62 is coupled to emitter "E" of IGBT 10. Voltage control circuit 62 includes a zener diode 64 and a diode 66 coupled in series.

In addition, gate resistance 52 is provided to represent resistance from a gate control circuit (the remainder of which is not shown). Gate resistance 52 is coupled to the input of current amplifier 54 which in turn is connected to gate "G" of IGBT 10. In some embodiments, current amplifier 54 is a push-pull amplifier adapted to drive gate "G".

In operation, upon detection of a short-circuit within a load (not shown) when a bus voltage is directly applied to the collector of the IGBT, switch 42 is closed and the voltage at gate "G" is limited by the voltage control circuit 62. In some embodiments, in the event of a short circuit, the voltage at gate "G" ranges around 15 volts and is limited to around 13 volts by voltage control circuit 62. This arrangement allows desaturation of IGBT 10 before turn-off according to the process described above regarding FIG. 4 and FIG. 5. Additionally, this arrangement also enables the circuit to lower the voltage at gate "G" upon detection of a short-circuit.

Figure 7:
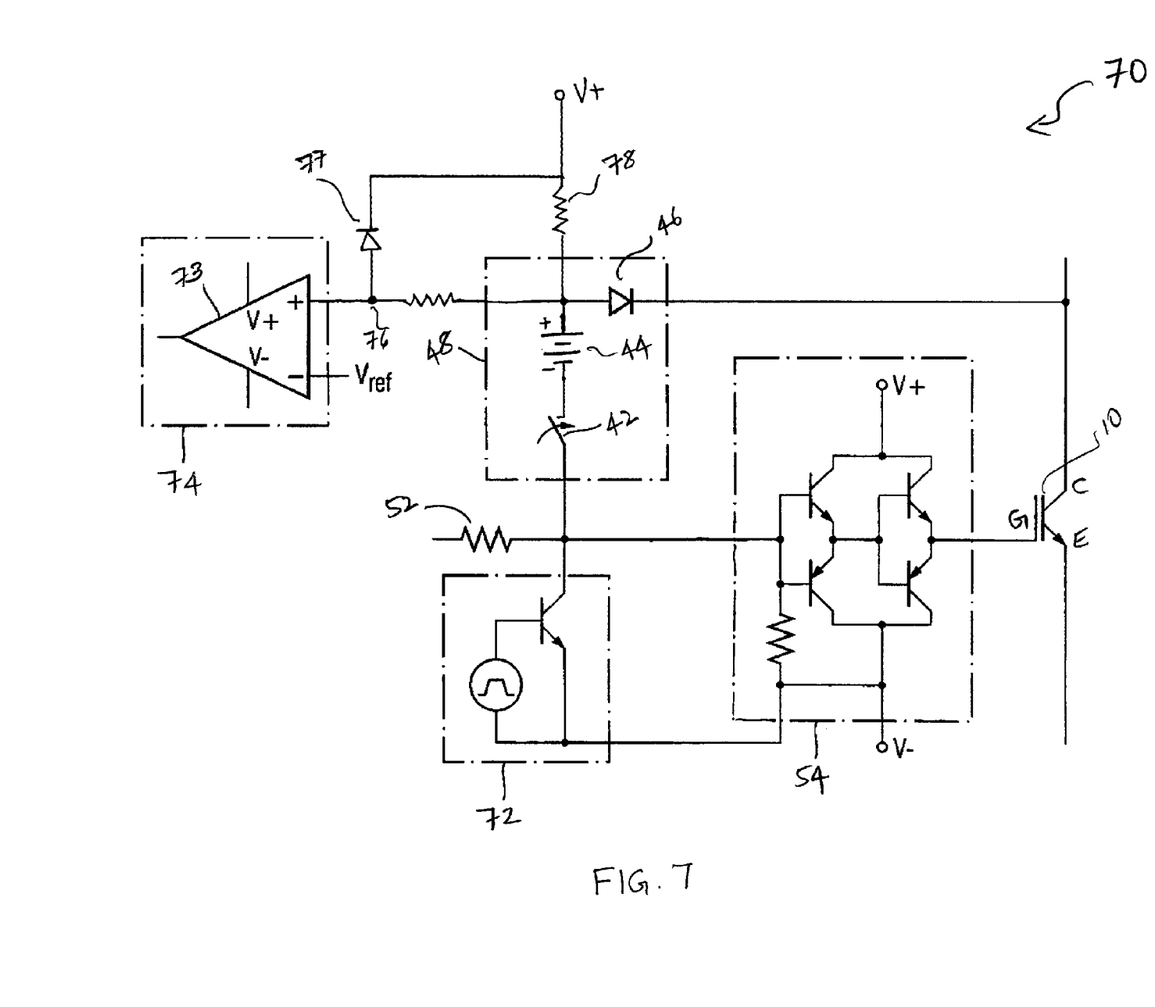
FIG. 7 is a schematic view of the desaturation circuit in accordance with FIG. 6 illustrating a short circuit detection circuit, according to some embodiments of the invention.

FIG. 7 is a schematic view of a circuit 70 for an IGBT in accordance with FIG. 5 illustrating a desaturation circuit 48 and a short circuit detection circuit 74, according to some embodiments of the invention. Desaturation circuit 48 and current amplifier 54 are coupled between gate "G" and collector "C" of IGBT 10. As mentioned above, desaturation circuit 48 includes, switch 42, voltage source 44, and diode 46 coupled in series. Anode of diode 46 is coupled to the voltage source and cathode of diode 46 is coupled to collector "C" of IGBT 10. Additionally, a second switching mechanism 72 is coupled to switch 42 and current amplifier 54. Desaturation circuit 48 is also coupled to short-circuit monitoring circuit 74 through node 76. Short-circuit monitoring circuit 74 includes a comparator 73 powered by voltages V+ and V−.

Desaturation circuit 48 and resistor 78 are coupled in series to a voltage potential (V+) which is around 15 volts.

The above described arrangement shown in FIG. 7, provides desaturation and short circuit detection for IGBT 10 in circuit 70. The desaturation operation is similar to that described above for FIG. 4 and FIG. 5. With regard to short-circuit detection, in some embodiments, a potential at node 76 is monitored and compared to a reference voltage $V_{ref}$ in a comparator 73. Comparison of potential at node 76 to reference voltage $V_{ref}$ enables the detection of a short-circuit. Upon detection of a short circuit, an output signal adapted to turn-off IGBT 10 is generated by comparator 73.

In some embodiments, in the absence of a short circuit, diode 46 is in conduction state when the $V_{CE}$ of IGBT 10 is turned on (conduction state). Current flows from V+ over resistor 78, diode 46 and into collector "C". The voltage at anode of diode 46 is "LOW". In some embodiments, the voltage at anode of diode 46 is below about 10V. In the presence of a short circuit at the load (not shown), the $V_{CE}$ is at a high voltage (typically, the bus voltage). During this time, the diode 46 is not conducting, the voltage at the anode of diode 46 is V+ ("High"). In some embodiments, the reference voltage $V_{ref}$ of comparator 73 is set at around 8 Volts. This allows comparator 73 to compare the input voltage at node 76 to $V_{ref}$ and detect a short circuit. In some embodiments, the detection of short circuit is only available when IGBT 10 is turned on.

Figure 8:
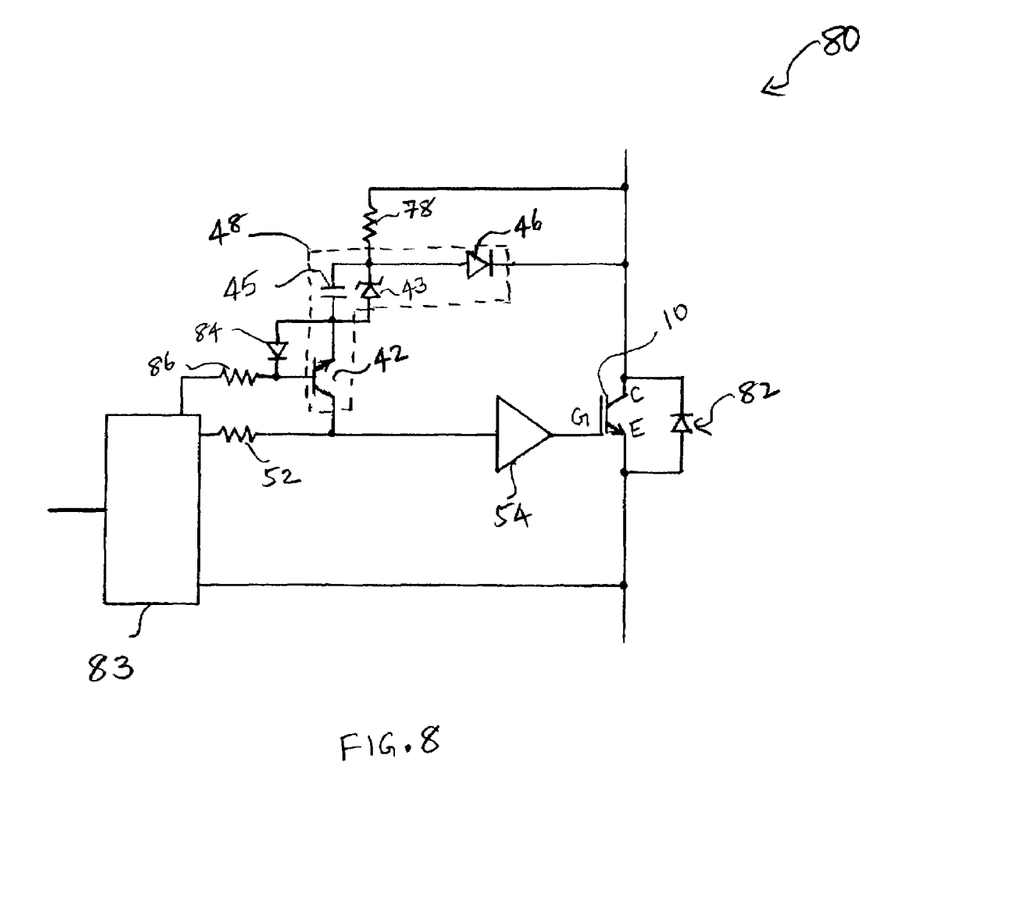
FIG. 8 is a schematic view of the desaturation circuit in accordance with FIG. 5 illustrating a transistor functioning as a switch and a charged capacitor providing as a voltage source, according to some embodiments of the invention.

FIG. 8 is a schematic view of a circuit 80 for an IGBT in accordance with FIG. 5 illustrating a transistor 42 used as a switch and a charged capacitor 45 used as the voltage source 44 in accordance with some embodiments of the invention. Circuit 80 also includes a logic circuit 83 configured to drive gate "G" of IGBT 10. Capacitor 45 is charged through resistor 78 when IGBT 10 is turned off. In some embodiments, a zener diode 43 is coupled in parallel to capacitor 45 to clamp the voltage across capacitor 45 to the zener breakdown voltage. In some embodiments, due to the voltage limitation of available zener diodes, a series of zener diodes can be used to achieve higher voltages. In some embodiments, the voltage across zener diodes coupled in series, depends upon the blocking voltage ratings of IGBT 10. In some embodiments, the voltage across the zener diodes coupled in series, is around 80% of the bus voltage. In some embodiments, the combined voltage achieved through coupling of zener diodes in series is between about 600 Volts and about 6500 Volts. The desaturation operation in circuit 80 is similar to that described above for FIG. 4 and FIG. 5.

Figure 9:
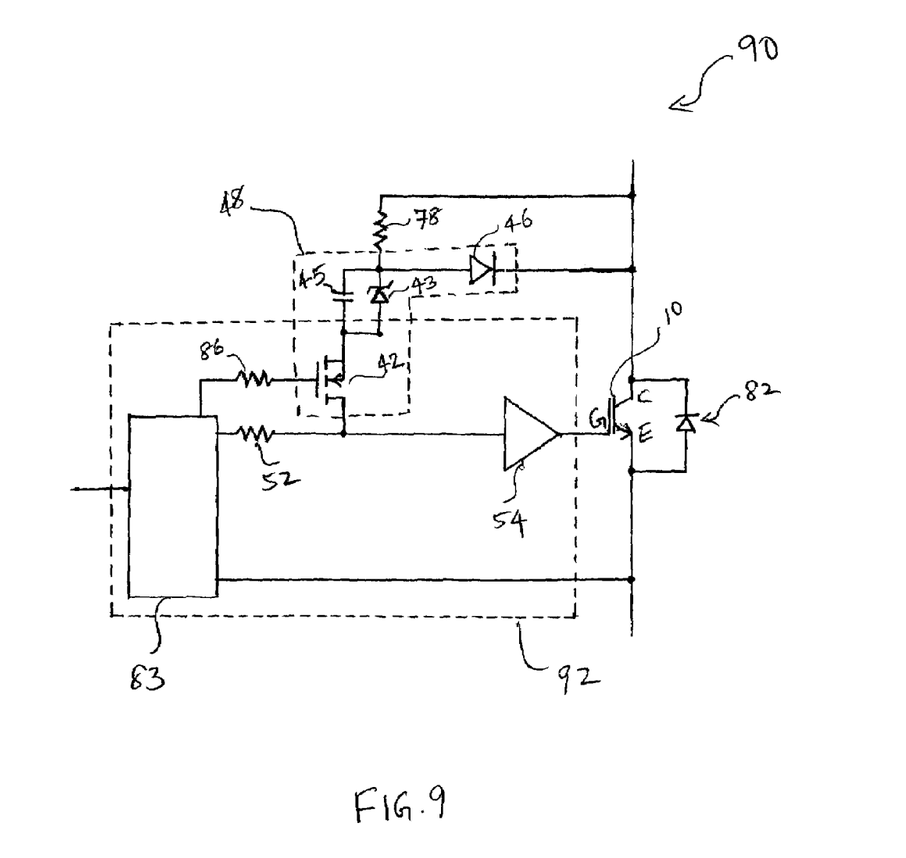
FIG. 9 is a schematic view of the desaturation circuit in accordance with FIG. 8 illustrating a MOSFET functioning as a switch, according to some embodiments of the invention.

FIG. 9 is a schematic view of a circuit 90 for an IGBT in accordance with FIG. 8 illustrating a MOSFET 42 functioning as a switch, according to some embodiments of the invention. In some embodiments, logic circuit 83, switch 42 and current amplifier 54 are all included in an integrated circuit 92.

In some embodiments, high voltage (greater than about 15 Volts) rated parts are used in the desaturation circuit between gate to the collector. This arrangement achieves high desaturation levels (greater than about 10 Volts) at the collector "C" of IGBT 10. Consequently, the rest of the gate driver circuit can be fabricated using standard integrated circuit technology. This arrangement advantageous over the prior art which requires zener diode to be coupled in series to the gate to achieve higher input voltages (greater than about 25 Volts) for the input signal. In some embodiments, high-voltage isolation is provided in the gate driver circuit using pulse-transformer (with or without a core) or other junction isolating, opto-isolation, SOI-isolation techniques.

Figure 10:
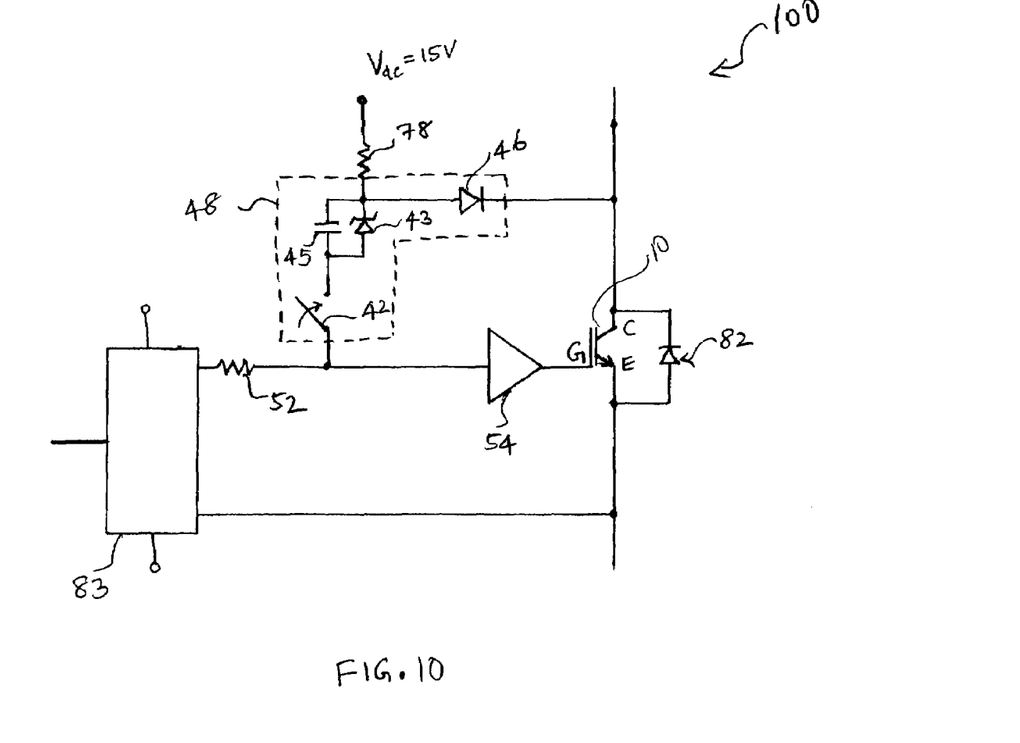
FIG. 10 is a schematic view of the desaturation circuit in accordance with FIG. 5, according to some embodiments of the invention.

FIG. 10 is a schematic view of some embodiments of a circuit 100 for an IGBT, illustrating a desaturation circuit 48 and a logic circuit 83, according to some embodiments of the invention. Resistor 78 is coupled to a voltage source $V_{dc}$ operating at a voltage of about 15 volts. Capacitor 45 is charged through resistor 78 when IGBT 10 is turned off. As described under FIG. 9, a zener diode 43 is coupled in parallel to capacitor 45 to clamp the voltage across capacitor 45 to the zener breakdown voltage. In some embodiments, due to the voltage limitation of available zener diodes, a series of zener diodes can be used to achieve higher voltages. The desaturation operation in circuit 100 is similar to that described above for FIG. 4 and FIG. 5.

Figure 11:
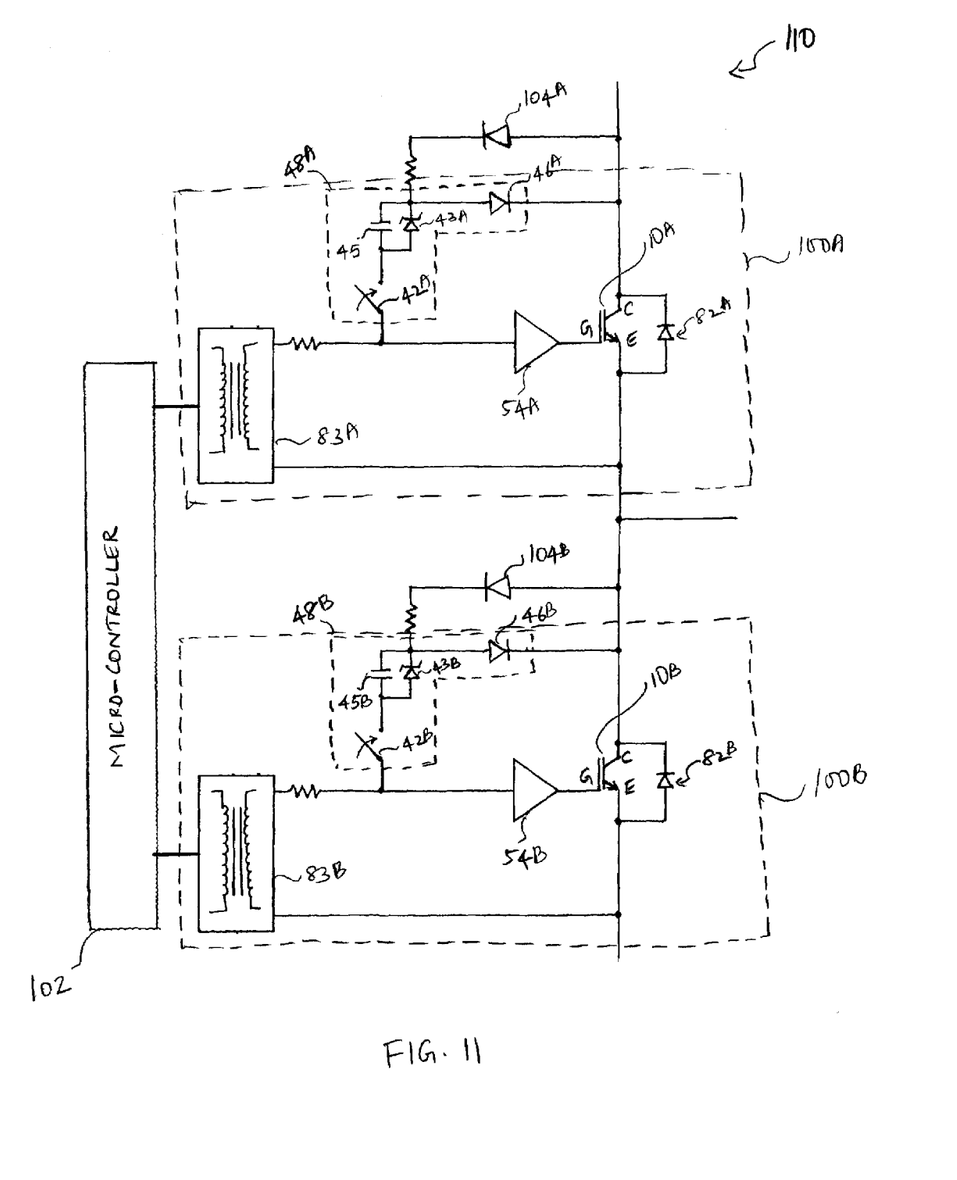
FIG. 11 is a schematic view of a half bridge circuit illustrating two IGBTs switching a bus voltage between a positive bus voltage and a negative bus voltage according to some embodiments of the invention.

FIG. 11 is a schematic view of a half bridge circuit 110 illustrating two IGBTs switching a bus voltage between a positive bus voltage and a negative bus voltage in accordance with some embodiments of the invention. The arrangement shown in FIG. 11 includes two similar circuits 100A and 100B as shown in FIG. 10 coupled to a micro-controller 102. Micro-controller 102 controls the logical circuits 83A and 83B which in turn drives the gates of IGBTs 10A and 10B. Each of circuits 100A and 100B includes desaturation circuits 48A and 48B, respectively. The operation of desaturation circuits 48A and 48B are the same as that described above for FIG. 4 and FIG. 5.

Figure 12:
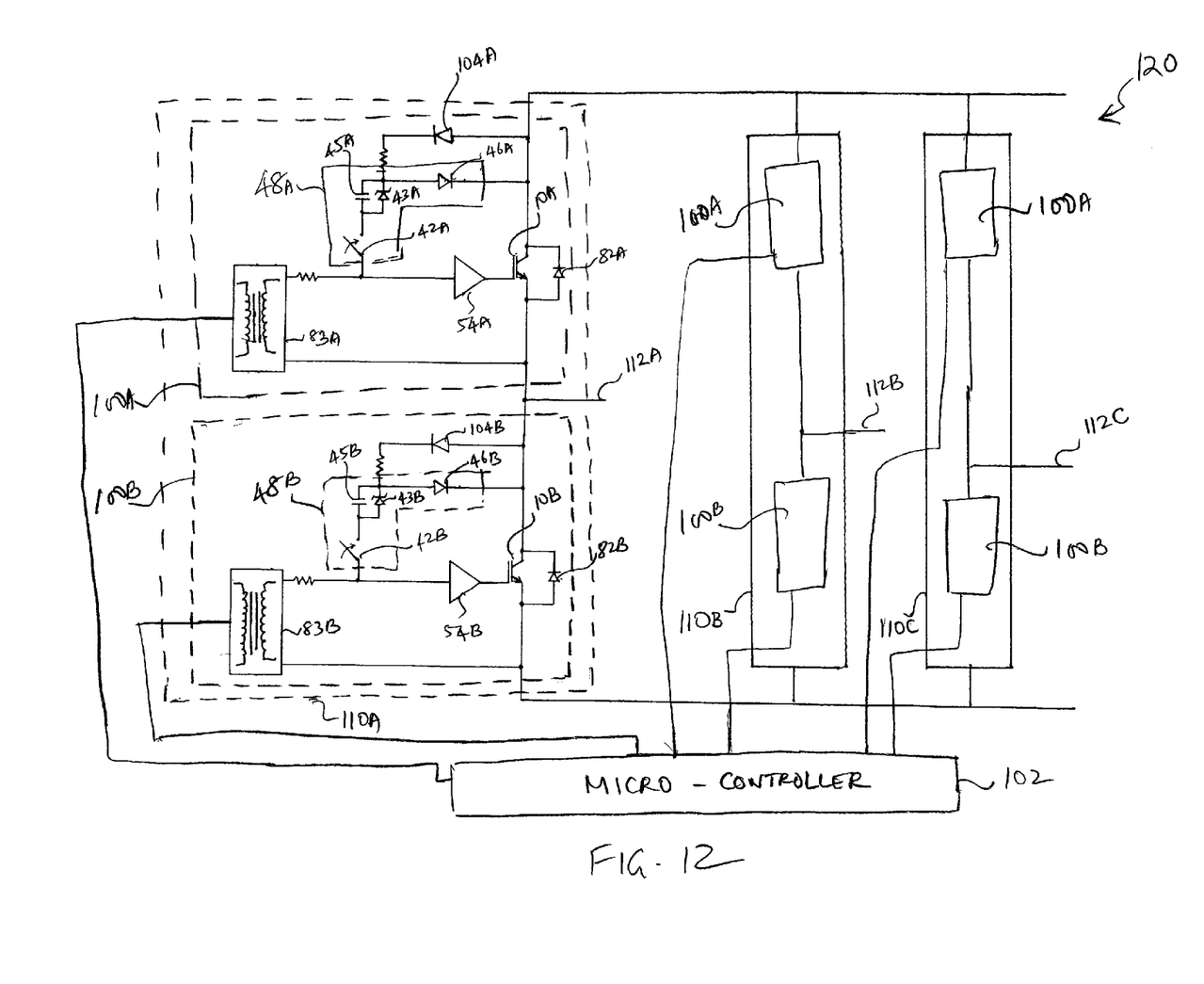
FIG. 12 is a schematic view of a three phase inverter showing three half bridge circuits shown in FIG. 11, according to some embodiments of the invention.

FIG. 12 is a schematic view of a three phase inverter circuit 120 illustrating three half bridge circuits, namely a first switching module 110A, a second switching module 110B, and a third switching module 110C as shown in FIG. 11, according to some embodiments of the invention. Each of the switching modules 110A, 110B, and 110C includes two circuits 100A and 100B described above in FIG. 11. Each of circuits 100A and 100B includes desaturation circuits 48A and 48B, respectively. The operation of desaturation circuits 48A and 48B is similar to that described above for FIG. 4-10.

Figure 13:
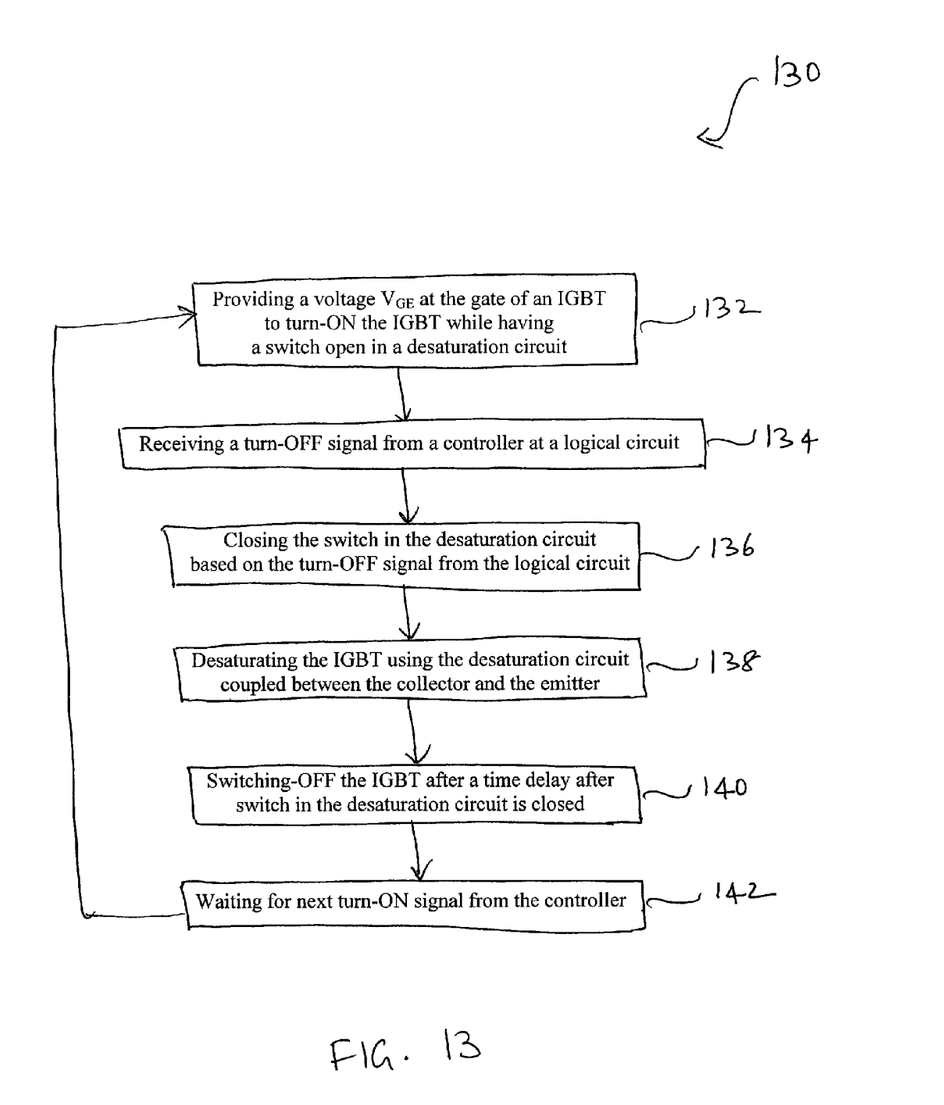
FIG. 13 is a flow chart representing the method of operation of the desaturation circuit provided for an IGBT, according to some embodiments of the invention.

FIG. 13 is a flow chart 130 representing the method of operation of the desaturation circuit provided for an IGBT, according to some embodiments of the invention.

At block 132, a voltage $V_{GE}$ is provided at the gate "G" of IGBT 10 (FIG. 4-12) to switch the IGBT to an "ON" state of operation. While IGBT 10 is in the "ON" state, switch 42 in desaturation circuit 48 is left open.

At block 134, a turn-OFF signal is received at a logical circuit 83 from a controller 102.

At block 136, switch 42 is closed based on the turn-OFF signal received from logical circuit 83.

At block 138, desaturation circuit 48 discharges the Miller capacitance due to accumulated charge between gate "G" and collector "C" by closing switch 42.

At block 140, the IGBT is switched-OFF after a given time delay of closing the switch in the desaturation circuit into the closed position.

At block 142, the process waits for the next IGBT turn-ON signal sent from the controller. Once the turn-ON signal is received the process continues to block 132.

In some embodiments, IGBTs described herein may be used in applications such as motor drives, welding machines, inductive heating, power factor correction, un-interrupted power supply (UPS), microwave ovens, inverters, switched mode power supply (SMPS), lamp ballast, or a low noise dimmer.

It should be noted that the methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A driver circuit comprising:
    an insulated gate bipolar transistor having a collector coupled to a voltage supply, an emitter coupled to a source of reference potential, and a gate configured to receive a control signal from a driver circuit, wherein the voltage supply comprises a capacitor and a zener diode coupled in parallel; and
    a desaturation circuit conductively coupled between an insulated gate and a collector of the insulated gate bipolar transistor to desaturate the insulated gate, the desaturation circuit including a series coupled bias voltage source, uni-directionally conducting element, and a switch, wherein the switch is coupled between the insulated gate and the bias voltage source.

2. The driver circuit of claim 1, including a current amplifier operatively coupled to the gate of the insulated gate bipolar transistor.

3. The driver circuit of claim 2, wherein the current amplifier further comprises a push-pull amplifier.

4. The driver circuit of claim 2, wherein the current amplifier and the switch are included in an integrated circuit.

5. The driver circuit of claim 1, further comprising a voltage control circuit coupled between the emitter of the insulated gate bipolar transistor and the cathode of the voltage supply.

6. The driver circuit of claim 5, wherein the voltage control circuit comprises a zener diode.

7. The driver circuit of claim 1, wherein the switch comprises a transistor.

8. The driver circuit of claim 1, wherein the switch further comprises a MOSFET.

9. The driver circuit of claim 1, further comprising a short-circuit detection circuit.

10. The driver circuit of claim 9, wherein the short-circuit detection circuit includes a comparator.

11. A half-bridge circuit, comprising:
a high-side IGBT connected between an input voltage and a first node, and a low-side IGBT connected between the first node and a reference voltage, the high-side IGBT having a high-side desaturation circuit electrically coupled between an insulated gate and a collector of the high-side IGBT, the low-side IGBT having a low-side desaturation circuit electrically coupled between an insulated gate and a collector of the low-side IGBT, wherein the high-side IGBT and the low-side IGBT are configured to switch between a conducting state and a blocking state and each of the high-side desaturation circuit and the low-side desaturation circuit includes a series coupled bias voltage source, uni-directionally conducting element, and a switch, wherein the switch is coupled between the insulated gate and the bias voltage source.

12. The circuit of claim 11, further comprises a microcontroller, a first logical circuit and a second logical circuit, wherein the first logical circuit drives the high-side IGBT and the second logical circuit drives the low-side IGBT.

13. The circuit of claim 11, wherein the switch includes a MOSFET.

14. A three-phase inverter circuit, comprising:
a first switching module including a first high-side IGBT connected between an input voltage and a first node, and a first low-side IGBT connected between the first node and a reference voltage, the first high-side IGBT having a first high-side desaturation circuit electrically coupled between an insulated gate and a collector of the first high-side IGBT, and the first low-side IGBT having a first low-side desaturation circuit electrically coupled between an insulated gate and a collector of the first low-side IGBT;

a second switching module including a second high-side IGBT connected between the input voltage and a second node, and a second low-side IGBT connected between the second node and the reference voltage, the second high-side IGBT having a second high-side desaturation circuit electrically coupled between an insulated gate and a collector of the second high-side IGBT, and the second low-side IGBT having a second low-side desaturation circuit electrically coupled between an insulated gate and a collector of the second low-side IGBT; and a third switching module including a third high-side IGBT connected between the input voltage and a third node, and a third low-side IGBT connected between the third node and the reference voltage, the third high-side IGBT having a third high-side desaturation circuit electrically coupled between an insulated gate and a collector of the third high-side IGBT, and the third low-side IGBT having a third low-side desaturation circuit electrically coupled between an insulated gate and a collector of the third low-side IGBT;

wherein the IGBTs are switched to generate a first AC voltage between the first and second nodes, a second AC voltage between the second and third nodes, and a third AC voltage between the third and first nodes;

wherein each of first, second, third high-side desaturation circuit and the first, second, third low-side desaturation circuit includes a series coupled bias voltage source, uni-directionally conducting element and a switch; and wherein the switch is coupled between the insulated gate and the bias voltage source.

15. The circuit of claim 14, wherein the switch includes a MOSFET.

16. The circuit of claim 14, further comprising a short-circuit detection circuit.

* * * * *